United States Patent
Warner et al.

(10) Patent No.: US 11,814,730 B2
(45) Date of Patent: Nov. 14, 2023

(54) METHODS FOR PRODUCING METAL OXIDE FILMS

(71) Applicant: WARNER BABCOCK INSTITUTE FOR GREEN CHEMISTRY, LLC, Mill Valley, CA (US)

(72) Inventors: John C. Warner, Mill Valley, CA (US); Emily Stoler, Mill Valley, CA (US); Dwight Tshudy, Mill Valley, CA (US); David Wolf, Mill Valley, CA (US)

(73) Assignee: Warner Babcock Institute for Green Chemistry, LLC, Mill Valley, CA (US)

( * ) Notice: Subject to any disclaimer, the term of this patent is extended or adjusted under 35 U.S.C. 154(b) by 6 days.

(21) Appl. No.: 16/618,563

(22) PCT Filed: Jun. 1, 2018

(86) PCT No.: PCT/US2018/035576
§ 371 (c)(1),
(2) Date: Dec. 2, 2019

(87) PCT Pub. No.: WO2018/222976
PCT Pub. Date: Dec. 6, 2018

(65) Prior Publication Data
US 2020/0165730 A1 May 28, 2020

Related U.S. Application Data

(60) Provisional application No. 62/514,094, filed on Jun. 2, 2017.

(51) Int. Cl.
*C23C 18/12* (2006.01)
*C23C 18/14* (2006.01)
(Continued)

(52) U.S. Cl.
CPC .......... *C23C 18/1216* (2013.01); *C23C 18/06* (2013.01); *C23C 18/127* (2013.01);
(Continued)

(58) Field of Classification Search
CPC . C23C 18/1216; C23C 18/145; C23C 18/143; C23C 18/06; C23C 18/1254;
(Continued)

(56) References Cited

U.S. PATENT DOCUMENTS 5,514,822 A * 5/1996 Scott ................. H01L 27/11502
556/28
5,550,004 A * 8/1996 Honda ..................... C08G 8/38
430/270.1
(Continued)

FOREIGN PATENT DOCUMENTS

EP 3091103 A1 * 11/2016 ............. C23C 18/06

OTHER PUBLICATIONS

International Preliminary Report On Patentability for PCT Patent App. No. PCT/US2018/035576 (dated Dec. 3, 2019).
(Continued)

*Primary Examiner* — Brian K Talbot
(74) *Attorney, Agent, or Firm* — Cermak Nakajima & McGowan LLP; Malcolm K. McGowan

(57) ABSTRACT

Described herein is a technology for the creation of "smooth" metal oxide films or coatings using organic cross-linking agents to enable low-temperature sintering. These metal oxide films can be used in conjunction with low-melting temperature substrates, such as plastics, metal, metal oxide, and glass, providing exquisite control over surface roughness.

24 Claims, 10 Drawing Sheets

(51) Int. Cl.
*C23C 18/06* (2006.01)
*H01L 21/02* (2006.01)
*H01L 29/24* (2006.01)
*H01L 29/66* (2006.01)

(52) U.S. Cl.
CPC ........ *C23C 18/1254* (2013.01); *C23C 18/143* (2019.05); *C23C 18/145* (2019.05); *H01L 21/02* (2013.01); *H01L 21/02554* (2013.01); *H01L 21/02565* (2013.01); *H01L 29/24* (2013.01); *H01L 29/66* (2013.01)

(58) Field of Classification Search
CPC . C23C 18/127; H01L 21/02; H01L 21/02554; H01L 21/02565; H01L 29/24; H01L 29/66
USPC ........................................ 427/58, 126.3, 553
See application file for complete search history.

(56) References Cited

U.S. PATENT DOCUMENTS

| | | | | |
|---|---|---|---|---|
| 6,247,799 | B1* | 6/2001 | Sakamaki | B41J 2/14233 347/68 |
| 2002/0041928 | A1* | 4/2002 | Budaragin | C23C 18/1216 427/229 |
| 2003/0054207 | A1* | 3/2003 | Warner | C02F 1/725 428/702 |
| 2005/0035983 | A1* | 2/2005 | Cruchon-Dupeyrat | G03F 7/0002 346/140.1 |
| 2007/0042109 | A1* | 2/2007 | Fedurco | C07D 207/46 427/2.11 |
| 2008/0187724 | A1* | 8/2008 | Fujikawa | B29C 59/02 427/282 |
| 2009/0148711 | A1* | 6/2009 | Le Blanc | B32B 17/061 428/447 |
| 2010/0239824 | A1* | 9/2010 | Weitz | C23C 18/1233 428/172 |
| 2013/0122723 | A1* | 5/2013 | Vail | H01G 9/2031 438/795 |
| 2016/0367984 | A1* | 12/2016 | Delamarche | B01L 3/502707 |

OTHER PUBLICATIONS

International Search Report and Written Opinion for PCT Patent App. No. PCT/US2018/035576 (dated Oct. 29 2018).

Cannon, A. S., et al., "The Low Temperature Processing of Titanium Dioxide Films by the Addition of Trimesic Acid," J. Sol-Gel Science and Technol. 2005;36:157-162.

Johnson, A. M., et al., "Effect of pH on the Viscosity of Titanium Dioxide Aqueous Dispersions with Carboxylic Acids," J. Phys. Chem. A 2007;111:8139-8146.

Millaruelo, M., et al., "Photolabile Carboxylic Acid Protected Terpolymers for Surface Patterning. Part 2: Photocleavage and Film Patterning," Langmuir 2006;22:9446-9452.

Zhao, H., et al., "o-Nitrobenzyl Alcohol Derivatives: Opportunities in Polymer and Materials Science," Macromolecules 45.4, 2012, pp. 1723-1736.

* cited by examiner

Septum for VOC injection and measurement

Kalle plastic gas sample bag with VOC (10-15L, VOC ~ 30ppm)

TiO2 (P25)/terephthatic acid coating (0.036-0.1gram)

A

B

METHODS FOR PRODUCING METAL OXIDE FILMS

CROSS-REFERENCE TO RELATED APPLICATIONS

This application is a National Stage Entry under 35 USC 371 of PCT/US2018/035576, filed Jun. 1, 2018, which claims priority from U.S. provisional patent application 62/514,094, filed Jun. 2, 2017. The contents of these priority applications are incorporated herein by reference in their entirety.

SUMMARY

Described herein is a technology for the creation of "smooth" metal oxide films or coatings using organic cross-linking agents to enable low-temperature sintering. These metal oxide films can be used in conjunction with low-melting temperature substrates, such as plastics, metal, metal oxide, and glass, providing exquisite control over surface roughness.

Provided herein are two methods of producing metal oxide films. The first approach (sol-gel) involves the creation of a metal oxide sol-gel using hydrolysis of a metal alkoxide, followed by condensation and polymerization in the presence of an oligocarboxylic acid. The sol-gel is then heated at temperatures generally between 30-450° C., preferably between 200-250° C., to prepare it for coating. In some embodiments, it may be useful to improve sol-gel consistency by adding a binder (e.g. Carbowax) during the sintering process. The sol-gel is coated onto the substrate of choice by wire rod draw-down coating, spin coating, spray coating, dip-coating, screen printing, 3D printing, or combinations thereof. The film or coating is then heated to sintering temperature to produce a robust film or coating with appropriate physical, electrical, and chemical characteristics.

A second approach (dispersion) involves the use of metal oxide particles as a starting material. The particles are dispersed into water at a concentration of (typically but not limited to) about 15% w/v, along with up to 5% w/w of an oligocarboxylic acid (preferably up to 0.4% w/w), and placed in a ball grinder for 18 hours. As in the first approach, the dispersion can then be coated onto the surface of choice, then further sintered at temperatures up to 450° C.

Details of these approaches are found in Johnson A. M. et al., *J Phys Chem Acta* (2007) 111(33):8139-46; Cannon, A. S. et al., *J Sol-Gel Science and Tech* (2005) 36:157-162; and Cannon, A. S. et al., *Chem. Materials*, (2004) 16:5138-5140, the disclosures of which are incorporated herein in their entirety.

Also provided herein is a method of creating patterned metal oxide surfaces and composite metal oxide microchannel filtration membranes. The method employs a photoresist approach to preparing the microchannels.

The microchannels described herein enable improvement in or maximization of surface area, surface to volume ratio, and resilience to mechanical shear and stress. Such microchannels can be employed in a modular and scalable filtration approach that can be used either alone or in conjunction with a biofiltration reactor. Contaminated air passes through this microconcentrator device and VOC adsorb and concentrate onto the metal oxide. At predefined periods the concentrated VOC may be released from the surface by elevating the temperature of the microchannels using built-in microheaters. The adsorption is such that release of a specific VOC or classes of VOC can occur at a specific temperature. When used alone exposure to UV light will oxidize any absorbed VOC. This destroys the VOC and additionally offers a means of cleaning the filter.

Accordingly, in a first embodiment, the present application discloses a method of generating a metal oxide film in situ, comprising the steps of (a) providing a metal oxide film precursor and a linking agent precursor at a location; and (b) activating the linking agent precursor to form a linking agent; wherein the linking agent will react with the metal oxide film precursor to form a metal oxide film.

In another embodiment, the application discloses a method for producing a patterned structure on a substrate, comprising the steps of (a) coating the substrate with a layer comprising a metal oxide film precursor and a linking agent precursor; and (b) exposing the coated surface to patterned actinic radiation that activates the linking agent precursor in a patterned fashion to form a linking agent, wherein the linking agent will react with the metal oxide film precursor to form a metal oxide film in a patterned structure.

In another embodiment, the application discloses a method for producing a patterned structure on a substrate, comprising the steps of: (a) coating the substrate with a layer comprising a polymer and a photoacid generator; (b) exposing the coated substrate to patterned actinic radiation that converts the photoacid generator to a superacid; and (c) overlaying the coated substrate with a layer comprising a metal oxide film precursor and a linking agent precursor, wherein the superacid will react with the linking agent precursor to form a linking agent, and the linking agent will react with the metal oxide film precursor to form a metal oxide film in a patterned structure.

In another embodiment, the application discloses a patterned structure on a substrate made by the method comprising the steps of (a) coating the substrate with a layer comprising a metal oxide film precursor and a linking agent precursor; and (b) exposing the coated surface to patterned actinic radiation that activates the linking agent precursor in a patterned fashion to form a linking agent, wherein the linking agent will react with the metal oxide film precursor to form a metal oxide film in a patterned structure.

DETAILED DESCRIPTION

Described herein is a method of generating a metal oxide film in situ, comprising the steps of (a) providing a metal oxide film precursor and a linking agent precursor at a location; and (b) activating the linking agent precursor to form a linking agent; wherein the linking agent will react with the metal oxide film precursor to form a metal oxide film.

Figure 1:
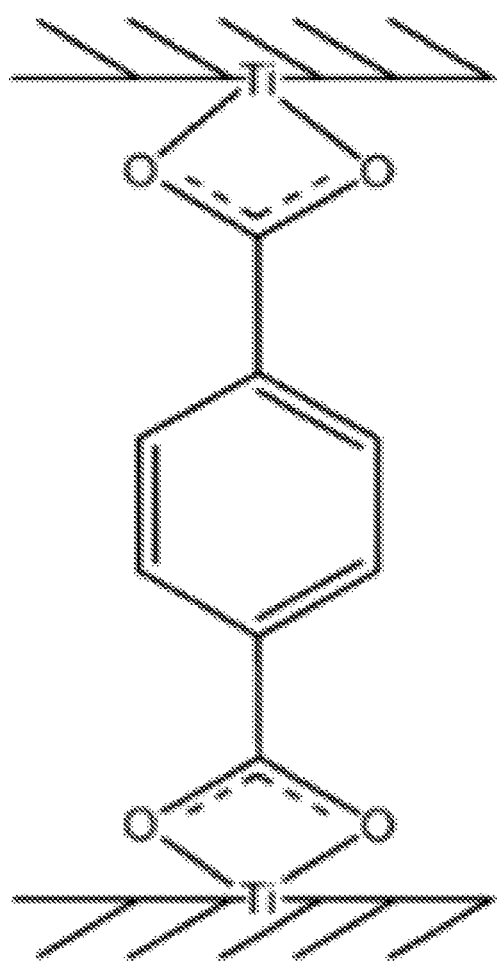
FIG. 1 shows a $TiO_2$ particle cross-linking with terephthalic acid.

As used herein, the term "metal oxide film precursor" refers to a composition of matter that provides metal oxides in a form easily transformable into a metal oxide film. Two preferred metal oxide film precursors are: (1) metal oxide particles; or (2) a metal oxide sol. FIG. 1, for example, shows a $TiO_2$ particles cross-linking with terephthalic acid to form a metal oxide film.

Suitable metal oxides include, but are not limited to, Actinium(III) Oxide ($Ac_2O_3$), Aluminum Oxide ($Al_2O_3$), Ammonium Antimony Tungsten Oxide ($NH_4OSbW$), Ammonium Boron Oxide (($NH_4)_2B_4O_7$), Ammonium Oxide (($NH_4)_2O$), Antimony(V) Oxide ($Sb_2O_5$), Astatine Oxide ($At_2O$), Barium Oxide (BaO), Beryllium Aluminum Oxide ($Al_6BeO_{10}$), Beryllium Oxide (BeO), Bismuth(III) Oxide ($Bi_2O_3$), Bismuth(V) Oxide ($Bi_2O_5$), Boron Oxide ($B_2O_3$), Cadmium Oxide (CdO), Calcium Oxide (CaO), Cerium(III) Oxide ($Ce_2O_3$), Cerium(IV) Oxide ($CeO_2$), Cesium Oxide ($Cs_2O$), Chromium(II) Oxide (CrO), Chromium(III) Oxide ($Cr_2O_3$), Chromium(IV) Oxide ($CrO_2$), Chromium(VI) Oxide ($CrO_3$), Cobalt(II) Oxide (CoO), Cobalt(III) Oxide ($Co_2O_3$), Copper Ytterbium Oxide ($Cu_2O_5Yb_2$), Copper(I) Oxide ($Cu_2O$), Copper(II) Iron(II) Oxide ($CuFe_2O_4$), Copper(II) Oxide (CuO), Deuterium Oxide ($D_2O$), Dysprosium Oxide ($Dy_2O_3$), Erbium Oxide ($Er_2O_3$), Ethylene Oxide ($C_2H_4O$), Europium(III) Oxide ($Eu_2O_3$), Francium Oxide ($Fr_2O$), Gadolinium(III) Oxide ($Gd_2O_3$), Gallium(II) Oxide (GaO), Gallium(III) Oxide ($Ga_2O_3$), Germanium(II) Oxide (GeO), Germanium(IV) Oxide ($GeO_2$), Gold(I) Oxide ($Au_2O$), Gold(III) Oxide ($Au_2O_3$), Hafnium Oxide ($HfO_2$), Indium(I) Oxide ($In_2O$), Indium(II) Oxide (InO), Indium(III) Oxide ($In_2O_3$), Iridium Oxide ($Ir_2O_3$), Iron(II,III) Oxide ($Fe_3O_4$), Iron(II) Oxide (FeO), Iron(III) Oxide ($Fe_2O_3$), Lanthanum Oxide ($La_2O_3$), Lead(II) Oxide (PbO), Lead(IV) Oxide ($PbO_2$), Lithium Oxide ($Li_2O$), Magnesium Aluminum Oxide ($Al_2MgO_4$), Magnesium Oxide (MgO), Manganese(II,III) Oxide ($Mn_3O_4$), Manganese(II) Oxide (MnO), Manganese(III) Oxide ($Mn_2O_3$), Manganese(IV) Oxide ($MnO_2$), Manganese(V) Oxide ($Mn_2O_5$), Manganese(VII) Oxide ($Mn_2O_7$), Mercury(I) Oxide ($Hg_2O$), Mercury(II) Oxide (HgO), Mesityl Oxide ($C_6H_{10}O$), Molybdenum(IV) Oxide ($MoO_2$), Molybdenum(V) Oxide ($Mo_2O_5$), Neodymium(III) Oxide ($Nd_2O_3$), Nickel(II) Iron(III) Oxide ($NiFe_2O_4$), Nickel(II) Oxide (NiO), Nickel(III) Oxide ($Ni_2O_3$), Niobium(III) Oxide ($Nb_2O_3$), Nitrous Oxide ($N_2O$), Osmium(III) Oxide ($Os_2O_3$), osmium(VI) Oxide ($OsO_3$), osmium(VIII) Oxide ($OsO_4$), Palladium(II) Oxide (PdO), Palladium(IV) Oxide ($PdO_2$), Phenylarsine Oxide (($C_6H_5$)AsO), Platinum(II,IV) Oxide ($Pt_3O_4$), Platinum(II) Oxide (PtO), Platinum(III) Oxide ($Pt_2O_3$), Plutonium(IV) Oxide ($PuO_2$), Plutonium(V) Oxide ($Pu_2O_5$), Potassium Oxide ($K_2O$), Radium Oxide (RaO), Rhodium(III) Oxide ($Rh_2O_3$), Rubidium Oxide ($Rb_2O$), Ruthenium(IV) Oxide ($RuO_2$), Ruthenium(VIII) Oxide ($RuO_4$), Scandium(III) Oxide ($Sc_2O_3$), Selenium Oxide ($Se_3O_4$), Silver(I) Oxide ($Ag_2O$), Sodium Oxide ($Na_2O$), Strontium Oxide (SrO), Tantalum(III) Oxide ($Ta_2O_3$), Tantalum(V) Oxide ($Ta_2O_5$), Technetium(II) Oxide (TcO), Thallium(I) Oxide ($Tl_2O$), Thallium(III) Oxide ($Tl_2O_3$), Tin(II) Oxide (SnO), Tin(IV) Oxide ($SnO_2$), Titanium(II) Oxide (TiO), Titanium(III) Oxide ($Ti_2O_3$), Titanium(IV) Oxide ($TiO_2$), Tungsten Chloride Oxide ($WCl_2O_2$), Tungsten(III) Oxide ($W_2O_3$), Tungsten(IV) Oxide ($WO_2$), Tungsten(V) Oxide ($W_2O_5$), Uranium(V) Oxide ($U_2O_5$), Vanadium Chloride Oxide ($VOCl_2$), Vanadium(II) Oxide (VO), Vanadium(III) Oxide ($V_2O_3$), Vanadium(IV) Oxide ($VO_2$), Vanadium(V) Oxide ($V_2O_5$), Ytterbium(III) Oxide ($Yb_2O_3$), Yttrium Barium Copper Oxide ($YBa_2Cu_3O_7$), Yttrium(III) Oxide ($Y_2O3$), Zinc(II) Oxide (ZnO), and Zirconium(IV) Oxide ($ZrO_2$).

Metal oxide particles suitable for use in the method described herein may be nanoparticles, i.e., they may be between about 1 and about 100 nm in size. Alternatively, metal oxide particles suitable for use in the method described herein may be microparticles, i.e., they may be between about 0.1 and about 100 μm in size.

When the metal oxide precursor is a metal oxide sol, the sol may be formed by hydrolyzing a metal alkoxide solution by acid catalysis in situ. Exemplary metal alkoxides include, but are not limited to, titanium alkoxides (such as titanium isopropoxide) and cerium alkoxide.

The term sol gel refers to the process by which a solution of precursor solution (e.g., a metal alkoxide solution) hydrolyses and evolves by polymerization to a gel-like biphasic system. The biphasic system comprises a solution or liquid phase of dissolved alkoxide in equilibrium with a solid phase of discrete particles and aggregates (or networks) of particles. In the sol-gel process the metal oxide begins as a monomer in solution, whereas in the dispersion process it begins as a nanoparticle, which is then aggregated.

The term "linking agent precursor", as used herein, refers to a molecule that can be activated and/or deprotected to form a "linking agent", which, as used herein, refers to a molecule that forms a link between metal oxides. A linking agent precursor for use in the method described herein may be a protected oligocarboxylic acid. Suitable oligocarboxylic acids include linear saturated dicarboxylic acids, aromatic dicarboxylic acids, diaromatic dicarboxylic acids, and tricarboxylic acids. Linear saturated dicarboxylic acids are generally of the formula $HO_2C(CH_2)_nCO_2H$, wherein n is an integer from 0 to 14. Aromatic dicarboxylic acids have the general formula $R^1—C_6H_4—R^2$, where $C_6H_4$ indicates a phenyl ring, $R^1$ and $R^2$ are independently $—(CH_2)_nCOOH$ wherein each n is independently an integer from 0 to 14, and the $R^1$ and $R^2$ substituents are ortho, meta or para on the ring. Diaromatic dicarboxylic acids have the general formula $R^1—C_6H_4—(CH_2)_m—C_6H_4—R^2$, where $C_6H_4$, $R^1$ and $R^2$ and n are defined above, and wherein m is an integer from 0 to 14.

In some embodiments, the dicarboxylic acid is a benzene dicarboxylic acid such as terephthalic acid (1,4-benzenedicarboxylic acid), 1,2-benzenedicarboxylic acid, or 1,3-benzenedicarboxylic acid. Other diaromatic dicarboxylic acids include fused structures such as 1,6-naphthalenedicarboxylic acid and bridged structures such as diphenylmethane-4,4'-dicarboxylic acid. In some embodiments, the dicarboxylic acid is a linear aliphatic dicarboxylic acid such as oxalic acid, malonic acid, succinic acid, glutaric acid, adipic acid, or pimelic acid.

Exemplary tricarboxylic acids include, but are not limited to, citric acid (2-hydroxypropane-1,2,3-tricarboxylic acid), isocitric acid (1-hydroxypropane-1,2,3-tricarboxylic acid), aconitic acid (prop-1-ene-1,2,3-tricarboxylic acid), propane-1,2,3-tricarboxylic acid, trimesic acid (benzene-1,3,5-tricarboxyic acid), and 1,2,4-benzenetricarboxylic acid. Also contemplated herein are higher-order oligocarboxylic acids such as tetra-acid structures including 1,2,4,5-tetracarboxylic acid, and 1,2,3,4-butanetetracarboxylic acid, as well as significantly branched dendritic structures such as PAMAM dendrimers with a succinic acid surface.

One or more carboxylic acid groups in the oligocarboxylic acids employed in the methods described herein may be protected by a blocking agent. Suitable blocking agents include, but are not limited to, tertiary alkyl/allyl esters. Other examples of carboxylic acid blocking groups include, but are not limited to, methyl esters, benzyl esters, Cert-butyl esters, esters of 2,6-disubstituted phenols (e.g., 2,6-dimethylphenol, 2,6-diisopropylphenol, 2,6-di-tert-butylphenol), silyl esters, orthoesters, oxazoline, organolithium reagents or Grignard (organomagnesium) reagents.

Blocking groups may further contribute to the composition after deprotection. For example, a removed blocking group may form a gas such as $CO_2$, isobutene, etc. which then can act as internal blowing agent, reducing structural density. Alternatively, the removed blocking group can provide other properties, such as further crosslinking, to enhance the resultant film matrix.

Regardless of the oligocarboxylic acid used, where the oligocarboxylic acid comprises n carboxylic acid groups, n−1 of those groups may be protected. In this embodiment, the oligocarboxylic acid binds to a $TiO_2$ moiety, thereby priming it for crosslinking. For example,

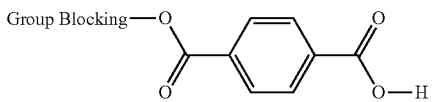

Alternatively, the oligocarboxylic acid may be fully protected. For example,

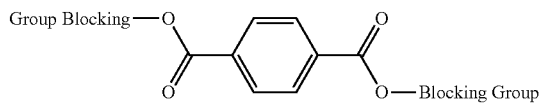

If the acid is fully protected, the linking agent precursor may be activated by deprotecting at least two protected carboxylic acid groups. Where n−1 carboxylic acid groups are protected, the linking agent precursor may be activated by deprotecting at least a second carboxylic acid group.

When the linking agent precursor is activated or deprotected, it may be thermally activated, chemically activated, or activated by exposure to actinic radiation, either directly or indirectly. Suitable forms of actinic radiation (as the term is used herein) include, but are not limited to, ultraviolet light, visible light, infrared light, electron beam, ion beam, and x-ray beam. For example, the linking agent precursor may comprise an o-nitrobenzoyl ester group that is directly cleaved by light to form a free carboxylic acid group and release o-nitrobenzaldehyde.

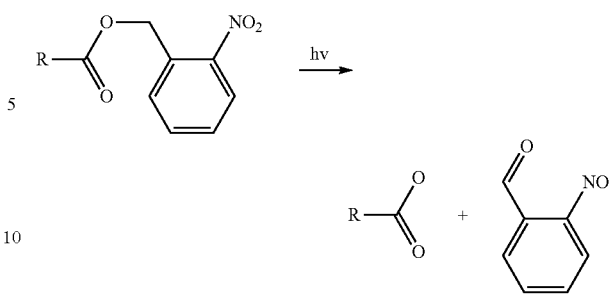

In an alternative embodiment using indirect activation, the method described herein further comprises the step of providing a photoacid generator at the location prior to step (b). In the case where a photoacid generator is provided, the photoacid generator is subsequently activated in step (b) by exposure to actinic radiation, thereby generating a superacid that cleaves a protecting group on the linking agent precursor to form a linking agent.

As used herein, the term "photoacid generator" refers to a molecule which, when exposed to suitable radiation, generates a superacid. Suitable photoacid generators include, but are not limited to, diphenyliodinium hexafluoroantimonate, bis(4-tert-butylphenyl)iodonium perfluoro-1-butanesulfonate, bis(4-tert-butylphenyl)iodonium p-toluenesulfonate, bis(4-tert-butylphenyl)iodonium triflate, boc-methoxyphenyldiphenylsulfonium triflate, (tert-butoxycarbonylmethoxynaphthyl)-diphenylsulfonium triflate, (4-tert-butylphenyl)diphenylsulfonium triflate, diphenyliodonium hexafluorophosphate, diphenyliodonium nitrate, diphenyliodonium perfluoro-1-butanesulfonate, diphenyliodonium p-toluenesulfonate, diphenyliodonium triflate, (4-fluorophenyl)diphenylsulfonium triflate, N-hydroxynaphthalimide triflate, (4-iodophenyl) diphenylsulfonium triflate, (4-methoxyphenyl)diphenylsulfonium triflate, 2-(4-methoxystyryl)-4,6-bis(trichloromethyl)-1,3,5-triazine, (4-methylphenyl)diphenylsulfonium triflate, (4-methylthiophenyl)methyl phenyl sulfonium triflate, (4-phenoxyphenyl) diphenylsulfonium triflate, (4-phenylthiophenyl)diphenylsulfonium triflate, triarylsulfonium hexafluorophosphate salts, triphenylsulfonium perfluoro-1-butanesufonate, triphenylsulfonium triflate, tris(4-tert-butylphenyl)sulfonium perfluoro-1-butanesulfonate, and tris(4-tert-butylphenyl) sulfonium triflate.

In an exemplary embodiment, the photoacid generator is diphenyliodinium hexafluoroantimonate and the actinic radiation is visible light, and exposure of the photoacid generator to visible light results in the creation of hexafluoroantimonic acid.

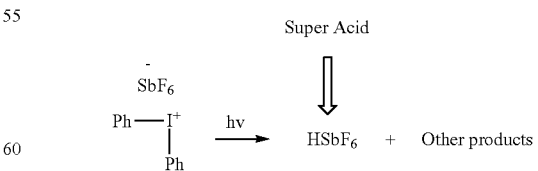

In some embodiments of the method provided herein, the metal oxide film precursor and linking agent precursor are provided as a mixture. Such a mixture may be formed by adding a linking agent precursor to a metal oxide film precursor.

Also provided herein is a method for producing a patterned structure on a substrate, comprising the steps of: (a) coating the substrate with a layer comprising a metal oxide film precursor and a linking agent precursor; and (b) exposing the coated surface to patterned actinic radiation that activates the linking agent precursor in a patterned fashion to form a linking agent, wherein the linking agent will react with the metal oxide film precursor to form a metal oxide film in a patterned structure.

Figure 2A:
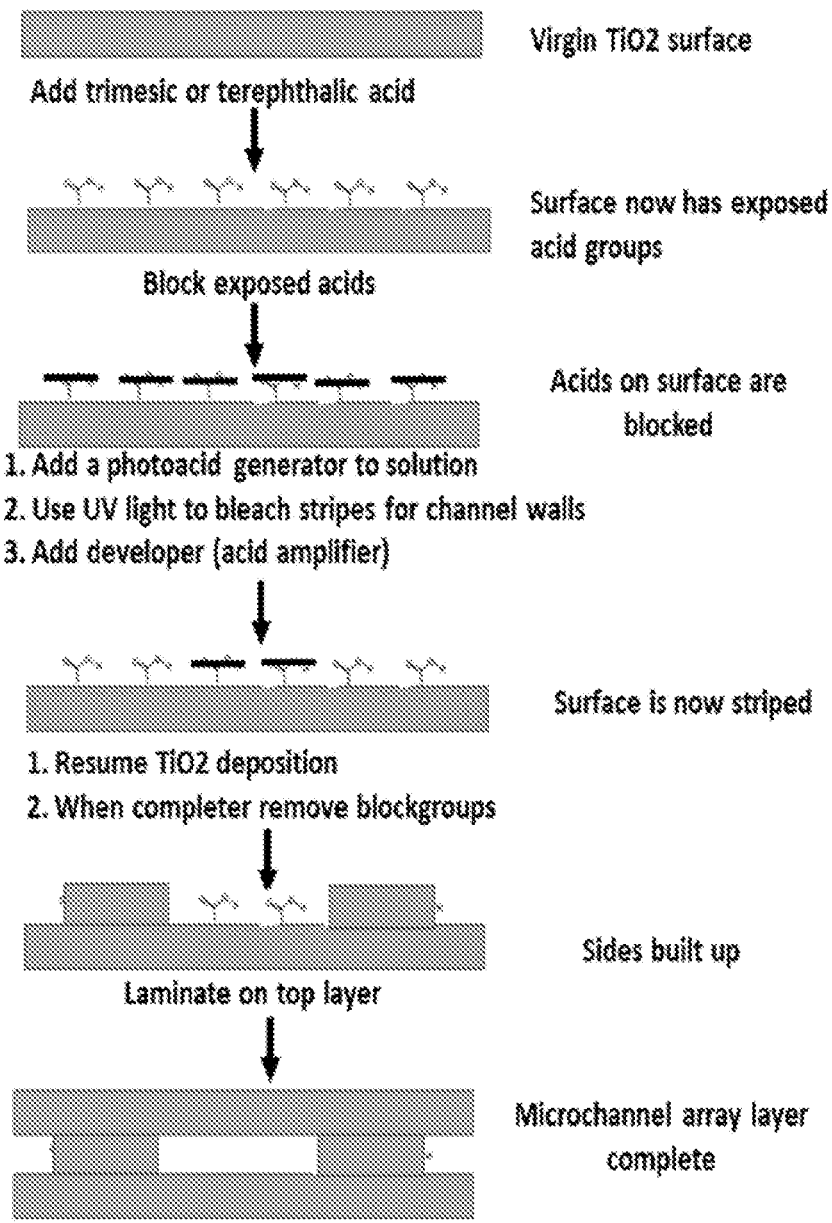
FIG. 2A is a schematic of a procedure for producing $TiO_2$ microchannels.

This method may be used, for example, to produce microchannels by a customized, photoresist approach, as shown in FIG. 2. Basically, it is an eight-step process, beginning with a metal oxide film prepared by the low-temperature sintering method described above. The virgin surface is then coated with an oligocarboxylic acid. Thus, there are free carboxylic acid groups on the surface. These free acid groups as then chemically blocked. The surface is then bathed in a solution photoacid generator. Actinic radiation (e.g., UV light) is then used to bleach stripes onto the surface. These will form the basis of the walls of the channels. The bleached stripes are then "developed" using an acid amplifier. Then metal oxide deposition, as described in the previous section, is resumed. Until the desire thickness is achieved. Blocking groups are chemically removed. Finally, a top metal oxide layer is laminated on, thus completing the single microchannel layer.

Figure 2B:
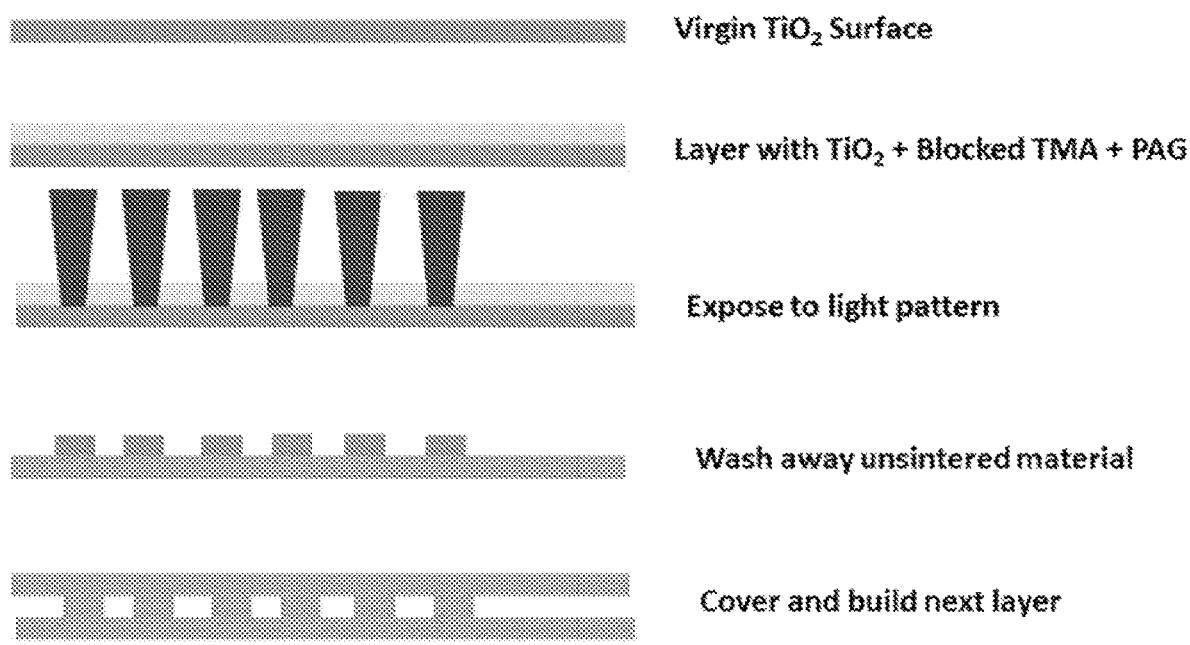
FIG. 2B is an alternate schematic of a procedure for producing $TiO_2$ microchannels.

In an alternative embodiment, shown schematically in FIG. 2b, one begins with a virgin metal oxide film prepared by the low-temperature sintering method described above. The virgin surface is then coated with a $TiO_2$ precursor layer that includes a blocked oligocarboxylic acid and a photoacid generator. Actinic radiation (e.g., UV light) is then used to bleach stripes, or other pattern, onto the surface. These will form the basis of the walls of the channels. The bleached stripes are then "developed" using an acid amplifier. The unexposed $TiO_2$ regions are then washed away. Finally, a top metal oxide layer is laminated on, thus completing the single microchannel layer.

In another alternative embodiment one begins with a substrate. The substrate may be glass, or may be a substrate coated with a layer of metal oxide film (produced in situ or deposited by known methods). A polymer coating containing a photoacid generator is then overlaid. The polymer may be polyvinylpyrrolidone (PVP) or poly(2-ethyl-2-oxazoline) (PEOX). The polymer-coated surface is then exposed to patterned actinic radiation that activates the photoacid generator to form a superacid in a patterned fashion. Immediately after radiation, the surface is overlaid with a layer of metal oxide film precursor and a linking agent precursor. The superacid will react with the linking agent precursor in the overlayer to form a linking agent, which will then react with the metal oxide film precursor to form a metal oxide film in a patterned structure.

Figure 3:
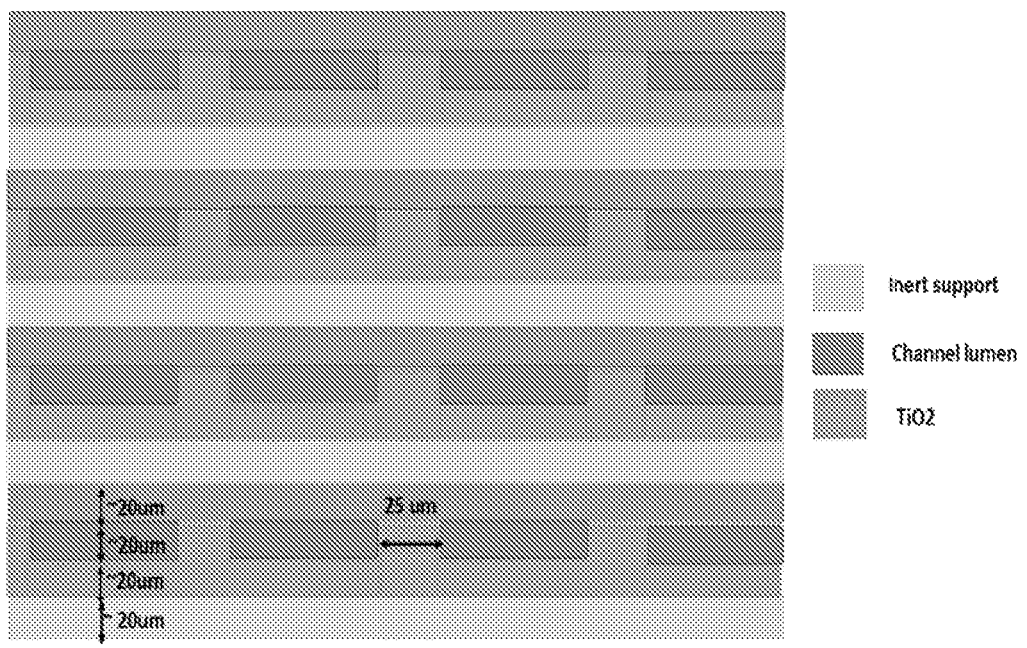
FIG. 3 shows a schematic of a microchannel array stack.

Two or more microchannel layers as described above may be combined to form a microchannel filter. A schematic illustration of a microchannel filter is shown in FIG. 3. This consists of laminate of stacked layers of a parallel microchannel array. For instance, the microchannels might be 100 μm×20 μm×10,000 μm. They may, for instance, be spaced ~25 μm apart, where there is ~20 μm of inert material between the layers. The inert material may be plastic, metal, or glass.

Figure 4:
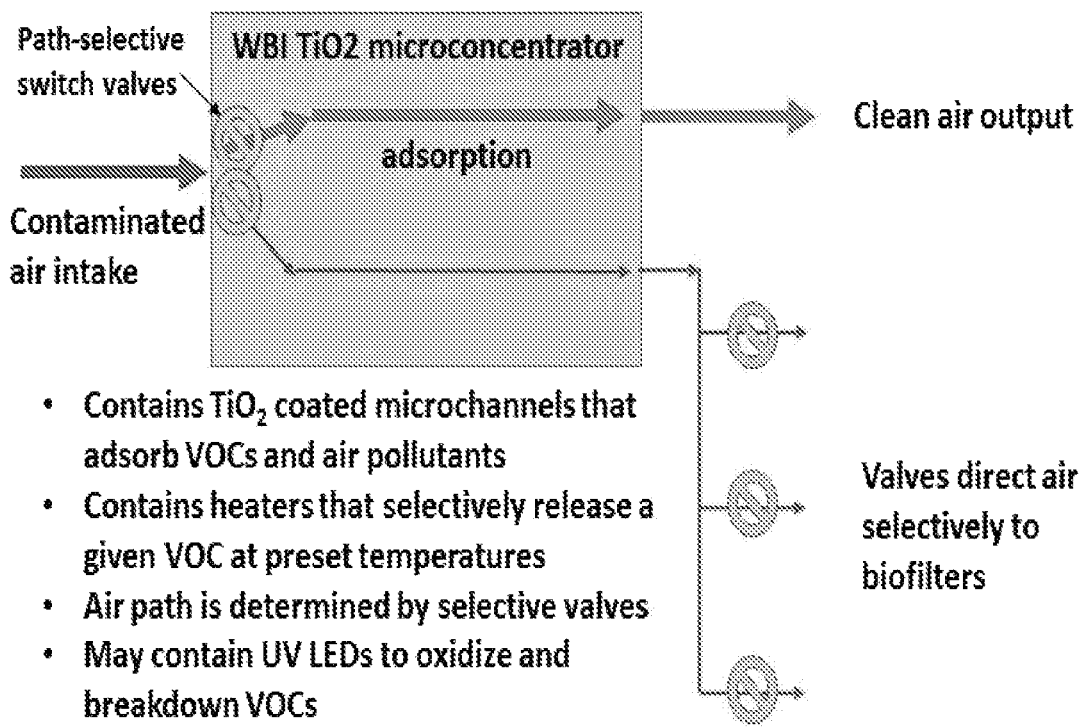
FIG. 4 shows a schematic of a biofiltration system.

One or more microchannel filters may be employed in a system for multiplexed concentration and filtration. One embodiment of this system is shown schematically in FIG. 4. Contaminated air enters through the air intake to a metal oxide microchannel filter; in the embodiment shown in FIG. 4 the metal oxide is $TiO_2$. As air passes over the metal oxide surface, Volatile Organic Compounds (VOCs) will rapidly adsorb to the metal oxide surface. Alternatively, the surface may be appropriately custom-coated or functionalized for specific VOCs or air pollutants. While some microchannels are collecting and therefore concentrating the VOCs, others may be subjected to local microheating to release a given VOC or class of VOCs into, for instance, biotreatment systems. Different temperatures will release different classes of air pollutants or may release them at different rates. After passing through the collection/concentration system, treated air exits the "clean air output." When the VOCs are released, switch valves under microprocessor control directs a small air stream into the appropriate VOC degrading-microbioreactor. Clean air from the microreactor can either be released back into the atmosphere, as shown, or fed back into the "dirty air intake," as desired.

Other applications of this technology include: production of UV-based water or air purification systems, low temperature production of metal oxide (e.g. $CeO_2$) barrier layers for solid oxide fuel cells (SOFCs), and micropatterning of arrays of solar cells.

A typical SOFC includes three main layers: a porous cathode layer (e.g. lanthanum strontium cobalt ferrite, LSCF); a solid electrolyte (e.g. yttria-stabilized zirconia, YSZ), and a porous anode layer. The device has an air side, where $O_2$ is delivered, and a fuel side, where the fuels such as $H_2$ and CO are delivered. At points along the cathode-electrolyte interface, $O_2$ molecules combine with 4 free electrons to become 2 $O^{2-}$. These negatively charged $O^{2-}$ atoms migrate towards the anode, and combine with fuel at points along the electrolyte-anode interface to produce either $H_2O$ or $CO_2$ and 2 $e^-$. Stoichiometrically and ideally, each $O_2$ molecule at the cathode combines with four electrons and then reacts with 2 H or 2 CO molecules at the anode to produce 2 $CO_2$ or 2 $H_2O$ molecules and 4 $e^-$.

Contact between the LSCF cathode layer and the YSZ electrolyte at high temperature can lead to the formation of an electrically resistive $SrZrO_3$ interfacial layer. To combat this, a samaria or gadolinium-doped ceria $(CeO_2)(SDC)$ layer is typically introduced. However, sintering of the SDC must be limited to ≤1200° C. in order to avoid Sr diffusion between the SDC and YSZ layers to form a resistive $SrZrO_3$ solid solution. Restricting $CeO_2$ ceramic sintering to ≤1200° C. limits the density of the ceria layer, which does not provide sufficient resistance to Sr diffusion. Denser SDC layers can be obtained by Pulsed Laser Deposition (PLD). However, this is a time consuming and costly process. There is a critical need for a low-cost method that can produce dense and stable SDC barrier layers at low temperature. The method of producing CeO2 layers described in this application offers a means of sinter at near-ambient temperatures.

EXAMPLES

Example 1

Preparation of $TiO_2$ Films

Preparation of $TiO_2$ Suspensions. Five grams of $TiO_2$ oxide powder (Sigma Aldrich, product #544841) was added to each of two ceramic ball mill jars (U.S. Stoneware, New Palestine, OH). 28.3 mL of milli-Q water was added to each jar. 0.035 g (0.7% to the weight of $TiO_2$) of trimesic acid (98%; Fisher Scientific) was added to one of the jars. Five ceramic balls were then placed in each jar. The jars were capped and placed on a U.S. Stoneware roller apparatus set to 85 rpm for 24 h. The suspensions were then probe-sonicated (Misonix S4000) on ice using a microtip with a 10 s pulse/5 s rest for a total of five min at an amplitude of 30.

Preparation of $TiO_2$ Sol-gel. Titanium isopropoxide (23.9 g, 84 mmol) was added dropwise, over 10 min, to 150 mL of 0.075 M nitric acid in a paraffin-covered beaker, while stirring vigorously. The volume of the solution was then reduced to 50 mL by heating to 80° C. under agitation for 8-12 h, then cooled to room temperature. Assuming 100% hydrolysis and polycondensation of the titanium isopropoxide, the solution contained 6.7 g of $TiO_2$. The solution was divided into three equal volumes and placed in vacuum sealed tubes. Amounts of trimesic acid, 0.056 g (2.5% w/w) and 0.112 g (5% w/w), were added to two solutions and the other was designated as the control. The tubes were sealed and heated in an oil bath to 130° C. for 18 h and the resulting suspensions were cooled to room temperature.

$TiO_2$ Film Coating. Each of the solutions were then deposited on substrate. To obtain thin ~20 µm thick coatings, deposition was done either with a wire-wound coating rod (0.9 mils in wet film thickness) or by spin coating (screen printing is also an option). The coatings were dried overnight at room temperature.

Sintering of the Films. Films were sintered at 70, 250, 500, and 1000° C. for 90 min. The oven door was then opened and the samples were allowed to cool to room temperature. 250° C. was found to be a sufficient sintering temperature.

Example 2

Effect of Trimesic Acid on Film Surface Characteristics

Solutions of $CeO_2$ were produced by the dispersion technique using 0%, 0.7%, 1.4%, and 3.5% trimesic acid, and were re-suspended by sonication. Each of the four suspensions were blade coated lengthwise onto four slides using Scotch Magic Tape No. 810 (3 mil) to maintain even wet coating thickness (~62.5 µm aqueous→final thicknesses of ~5 µm). The coatings were dried overnight at room temperature, sintered for 90 min at a given temperature (125, 250, 500, or 1000° C.), and prepared for SEM. Microscopic examination of the layers produced with 125° C. sintering revealed that, in the absence of trimesic acid, the individual nanoparticles are clearly visible and small cracks appear through the surface. As the amount of trimesic acid increased, the small cracks disappeared, the particles coalesced, the surface became denser and continuous except for some areas of larger crack formation. The cracking was a cooling artifact that can be eliminated by more careful annealing.

Example 3

Preparation of $CeO_2$ Films

Preparation of $CeO_2$ sol-gel. $Ce(NO3)3 \cdot 6H2O$ (99.5%, 10 g) was mixed with 20 mL of distilled water at 70° C. until a clear solution was obtained. $NH_4OH$ (14.8 M) was added to the mixture, forming a precipitate, which was then filtered and washed with water. The remaining solution was treated a second time, sequentially with 5.0 and 0.25 M $NH_4OH$, to get a second precipitate, which was also filtered and washed with water. The particles of the two precipitates were mixed in water and peptized with $HNO_3$ under agitation and heat at 70° C., until a clear milky sol was obtained at a pH of 1.5-2.5 with concentration of ~4.2 g $CeO_2$/L.

The solution was then divided into equal aliquots containing trimesic acid at varying concentrations (typically 0, 0.7, 1.4, and 3.5%) and placed in vacuum sealed tubes. Theses tubes were heated in an oil bath to 130° C. for 18 h and the resulting suspensions cooled to room temperature.

$TiO_2$ Film Coating. Each of the solutions were then deposited on glass microscope slides [previously washed with water, 1M sodium hydroxide and 1M hydrochloric acid] using a wire-wound coating rod (0.9 mils in wet film thickness) and dried overnight at room temperature.

Sintering of the Films. Films were sintered at different temperatures: 70 (Fisher Isotemp™ Model 737G), 250, 500, and 1000° C. (Fisher Isotemp™ Model 750-126 muffle oven). Films were sintered at 70, 250, 500, and 1000° C. for 90 min. The oven door was then opened and the samples were allowed to cool to room temperature.

Example 4

Microchanneled $TiO_2$ Film Preparation by Photoresist Method

Dispersions for the first coating were prepared from 10 wt % of P25 titanium dioxide anatase and 0.2 wt % terephthalic acid in 50/50 solution of isopropanol/water. Dispersion for the second coating were prepared from a mixture of 10 wt % of P25 titanium dioxide anatase, 0.8 wt % terephthalate ester and 0.15 wt % of diphenyliodonium hexafluorophosphate in a 50/50 solution of isopropanol and water. In both cases, the mixture was prepared in a ceramic container where 10 ceramic balls were added to the container. The suspension was rotated at a setting of 50 on a US Stoneware Ball mill roller for 24 h.

A first layer 100 µm thick composed of the 10% $TiO_2$ dispersion and 0.2% terephthalic acid slurry was blade coated onto a glass surface. (Note: this will dry down to form a 10 to 20 µm thick final ceramic layer.) The plate was then baked for an hour in the oven at 500° C.

The second 100 µm coat comprised of dispersion of 10 wt %, $TiO_2$ 0.8 wt % terephthalate ester and 0.15 wt % of diphenyliodonium hexafluorophosphate (the photoacid generator) was applied to the surface. In some cases, the dispersions were augmented with 1 to 3% (w/w) of a low MW binder such as carbowax or 400 MW polyethylene glycol.

The film was covered with a mask (either US Airforce Resolution target masks or Ronchi rulings with defined line spacings on quartz) and exposed to UV light at 254 nm (~5 mW/cm2 of UVC light) continuously for 70 min. The sample was then force-washed with tap water and in some cases after air-drying further sprayed air to remove excess material.

Figure 5:
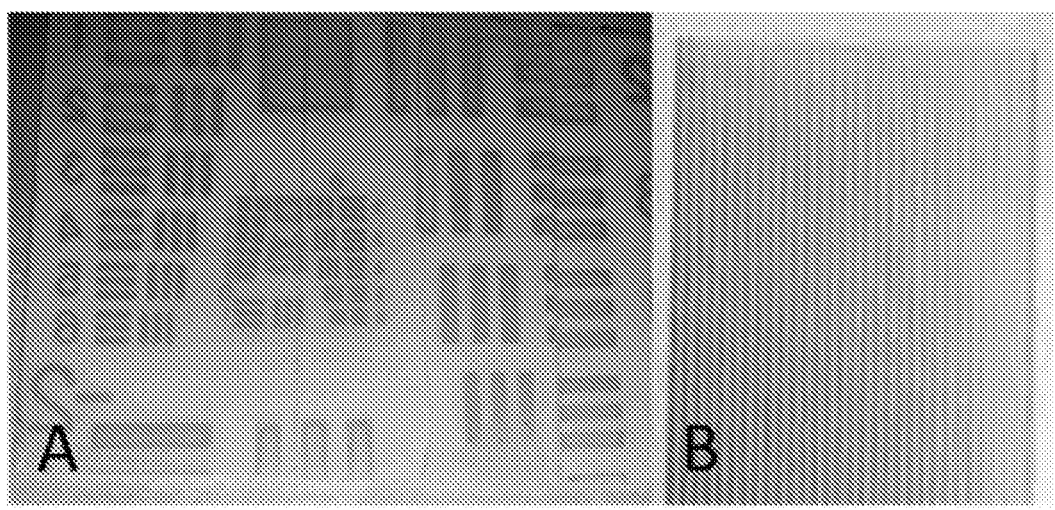
FIG. 5 shows photoresist of a USAF resolution ruling step 6 above (A), photoresist of microchannels created with a 400 μm width line Ronchi ruling (B).

The photoresist displayed a slight brownish yellow color rendering of what is essentially a latent image that enables resolution of the photoresist process to be determined. This is shown in FIG. 5A. On this basis, we concluded that the resolution of the photoresist process is ~157 µm. (Note the vertical lines are where we have cut the plate for further testing.) There are two rate-limiting factors that govern this optical resolution limit: 1. The fact that the current light source is not collimated. 2. The diffusional transport of photons once they enter the $TiO_2$. We believe that the dominant factor is the source collimation and are currently exploring how far this can be pushed.

Three methods of "washing" to remove uncross-linked TiO$_2$ have been employed: gentle aqueous washing on an orbital stirrer, forced-water washing with a spray bottle or faucet, and air-blowing. Typically, our preferred method was to use a forced-water wash followed by air drying of the plate for one hour and by air-blowing. This enables us to create viable microchannel.

Figure 6:
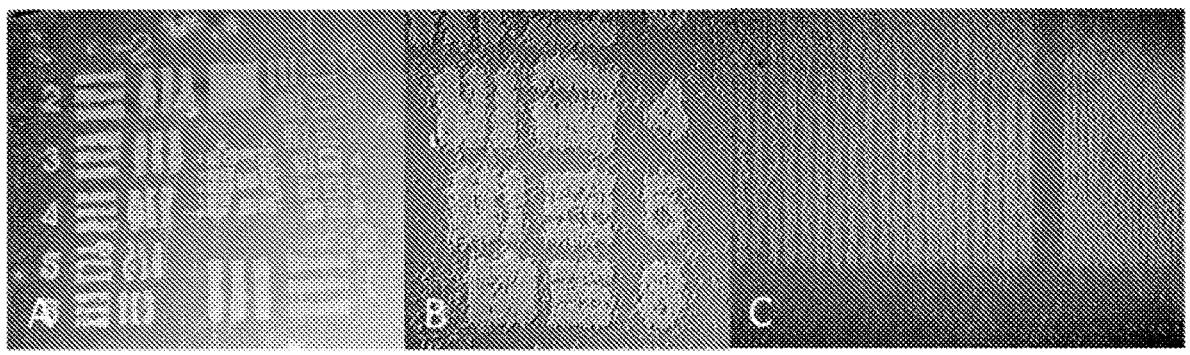
FIG. 6 shows terephthalic acid crosslinked $TiO_2$ microchannels made by the photoresist technique. USAF Calibration target (A & B), 400 μm and 200 μm photomask (C). Illumination is oblique to accentuate the upper layer.

FIGS. 6A & B show TiO$_2$ microchannels on a TiO$_2$ substrate created by this method using the USAF test pattern of different size Ronchi rulings. FIG. 6C shows microchannels created using the Ronchi ruling. Note that there is an ~2× decrease in resolution, which may be referred to as the "mechanical resolution." Note also, that there is a preferred direction for microchannel production. We believe that this results from the direction of the water and airflow used to remove uncross-linked TiO$_2$. The resolution limit for the USAF target is group −1 element 6; so the center-to-center spacing is 1.2 mm and the microchannels are ~200 µm.

Example 5

Measuring Adsorption of Toluene to TiO$_2$ Films

Figure 7:
FIG. 7 shows the experimental setup for measuring VOC adsorption to $TiO_2$ films using Nalophan bags.

In order to examine the VOC adsorption rate to our titania films, the following experiment was performed using Kalle Nalophan gas sample bags, as shown in FIG. 7.

A 3-foot-long Nalophan gas sample bag was cut from the bulk material. A 5 mL size glass vial was placed inside and both sides of the bag were sealed using cable ties, leaving a ~5 inch space on one end to store the TiO$_2$ coated glass slide. The TiO$_2$ coated glass slide was placed into the ~5 inch space and another cable tie was placed at the very end to isolate the slide.

Nitrogen was purged into the sealed sample bag through a septum on the outside surface at 500 mL/min. At the same time, 2.28 uL of toluene (to achieve ~30 ppm) was injected through the septum into the glass vial and nitrogen was blown over the toluene until it evaporated completely. The bag was then filled with more gas to reach 12.5 L.

The sample bag filled with 30 ppm toluene was incubated for 30-60 min to allow the concentration to reach a steady value. The VOC concentration was monitored by RAE PID meter with a needle through the septum.

The TiO$_2$ coated glass slide was introduced into the sealed bag by removing the cable tie separating it from the toluene-contaminated section. The bag was sealed at the same position to maintain the volume of test space. The VOC concentration was monitored at 0, 1, 2, and 3 h.

Figure 8:
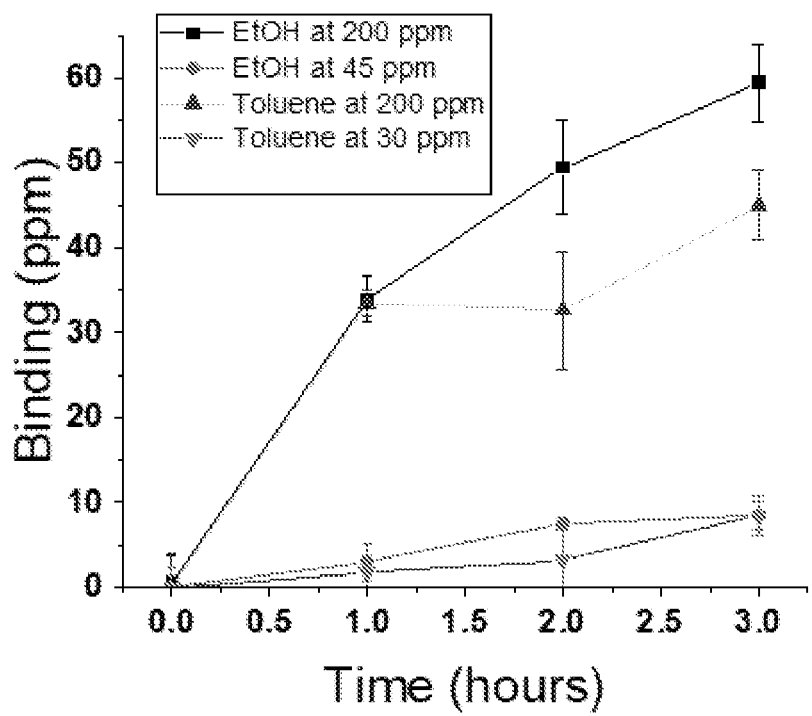
FIG. 8 shows toluene and ethanol adsorption to titania films at ~200 ppm and 30 ppm.

For these experiments, we initially concentrated on toluene and ethanol as representative of hydrophobic and polar VOCs. FIG. 8 shows binding data (experimental—TiO$_2$ control) for toluene and ethanol at starting concentrations of ~200 ppm and ~30 ppm.

We have performed such experiments as a function of thickness of the TiO$_2$ layer (mass), where we fixed the surface area and under conditions of constant thickness varying area. These experiments indicate that the critical element is surface area not thickness.

It should also be noted that it is difficult to interpret these experiments to obtain a rate of binding. In these Nalophan bag experiments there is no flow of air as in the ultimate device; so binding becomes a diffusion limited process. Nevertheless, these experiments demonstrate that VOCs bind to titania films at concentrations as low as 30 ppm.

Example 6

Measuring VOC Desorption From TiO$_2$ Films

Figure 9:
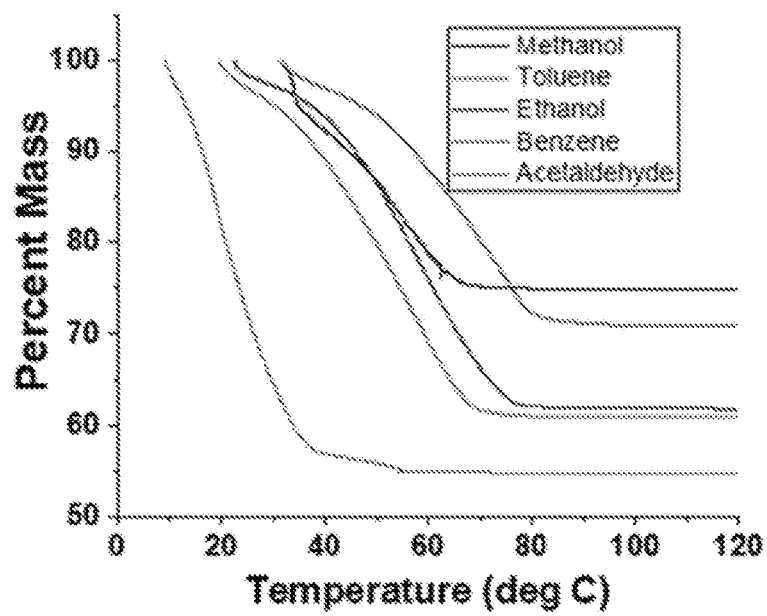
FIG. 9 shows desorption of VOCs from terephthalic acid crosslinked $TiO_2$, desorption (% initial mass) as a function of temperature (A), the same data analyzed for the change in % mass per min (B).
Figure 9:
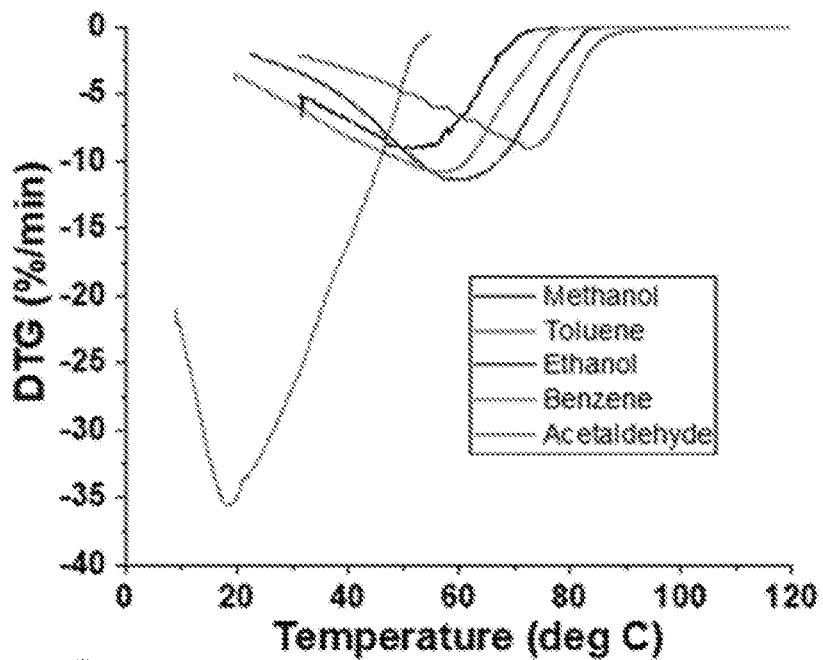

FIG. 9 shows the desorption of the five VOCs tested, measured by thermogravitometric analysis, to the terephthalic acid crosslinked titania. Here the titania was scraped off the plate and mixed with the VOC so as to achieve sufficient signal to accurately determine the mass change. The data is shown in two forms. FIG. 9A shows the decrease in mass as a function of temperature. FIG. 9B shows the derivative of the mass change with respect to heat flow.

This data can be used to calculate a mean transition temperature ($T_c$) and affinity constant of TiO$_2$ for the five VOCs tested, as shown in the following table.

| VOC | $T_c$ (° C.) |
| --- | --- |
| Methanol | 52 |
| Ethanol | 60 |
| Benzene | 58 |
| Toluene | 72 |
| Acetylaldehyde | 22 |

Example 7

Modifying VOC Affinity to Films by Additive Addition

Both the absolute and relative affinities of the TiO$_2$ to the different VOCs can be modulated by addition of additives to the TiO$_2$ films. Such potential additives include, but are not limited to, waxes, activated charcoal, SiO$_2$, and materials that additionally serve to stabilize the layers.

In general, the surface can be made more hydrophobic by treatment with simple organic acids, such as propionic acid or benzoic acid. Alternatively, the surface can be made more polar by reaction with carboxylated polyethylene glycol. Other useful treatments are salicylic acid and quaternary amines, where a first R group is a carboxylic acid and polarity/hydrophobicity can be controlled by modifying the R groups.

Figure 10:
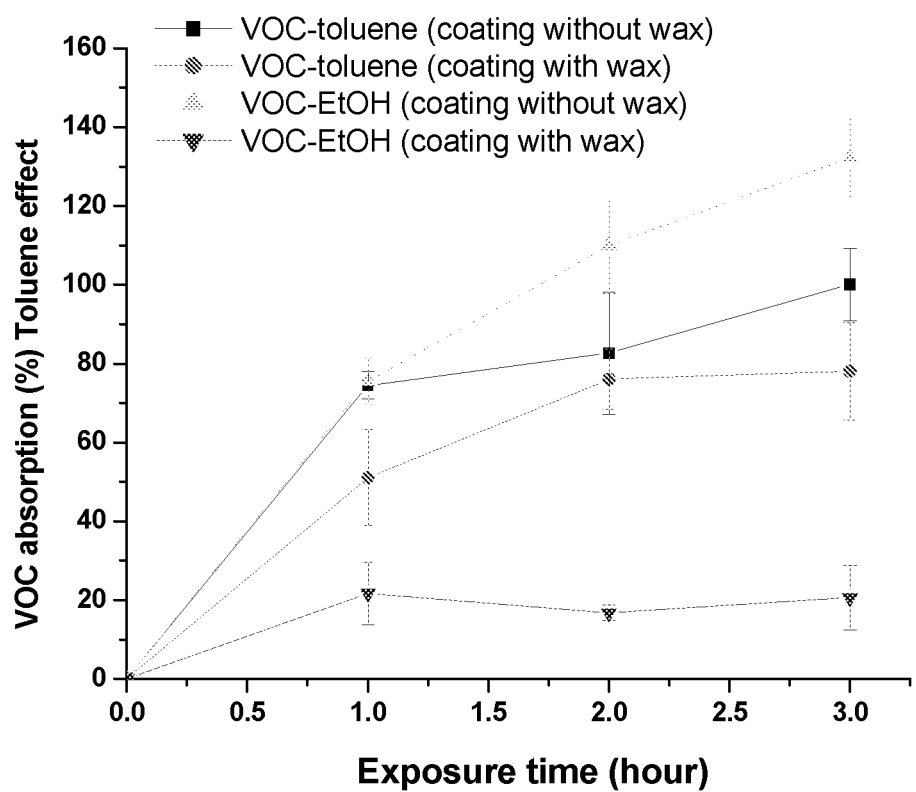
FIG. 10 shows the binding of ethanol and toluene to titania with and without carbowax.

To illustrate this point, we have performed an initial experiment to test the efficacy of using surface treatments to alter relative binding affinity. This is shown in FIG. 10 where we compare the binding of toluene and ethanol to untreated and carbowax treated TiO$_2$ films (3% wt/wt PEG—400). The affinity goes from ~1,2:1 ethanol:toluene to a 4:1 toluene:ethanol. Thus, the modification creates a surface that highly favors hydrophobic VOCs.

An alternative approach to surface modification is molecular templating. In templating a small amount of the VOC is added to the TiO$_2$ dispersion before blade coating. After the films are formed the VOC is volatized in an oven, leaving templated "holes" for selective binding.

Example 8

Alternative Method for Preparing TiO$_2$ Microchanneled Films

Stock solutions of the base, polyvinylpyrrolidone (PVP)/ photoacid generator, and top layer dispersions were prepared. The base layer dispersion was formulated using 15% P25 nano-TiO$_2$ (Evonik) plus 0.4% terephthalic acid (Sigma Aldrich), milled overnight on a ball mill with Alumina grinding media. The PVP layer solution was formulated using 5% PVP K60 (MW=345,000 g/mole typical)+0.15% diphenyliodonium hexafluorophosphate in ethanol. The top layer dispersion was formulated using 10% P25 nano-$TiO_2$+ 0.8% terephthalic acid di-t-butyl ester (ELN #ER8250) in ethanol. Mixed in a speedmixer cup at 1800 rpm for 10 min.

After the formulations were prepared, a glass substrate was prepared by washing, rinsing with deionized water, and air drying. The substrate was then wiped with ethanol before coating. The base layer dispersion was coated with a coating gauge or doctor blade to 0.002" wet thickness and dried 30 min at 110° C. The PVP layer solution was coated with a coating gauge or doctor blade to 0.002" wet thickness and air dried 1-2 min.

The coated sample was covered with a photomask, then photoexposed with 254 nm UV radiation for 2700 seconds. The exposed sample was then coated with the top layer dispersion with a coating gauge or doctor blade to 0.002" wet thickness, within 5 min of UV exposure and dried for 30 min at 110° C. The film was rinsed with a gentle stream of deionized water, then with a wedge-shaped spray of tap water until the pattern appeared. The film was then baked for 30 min at 110° C.

Figure 11:
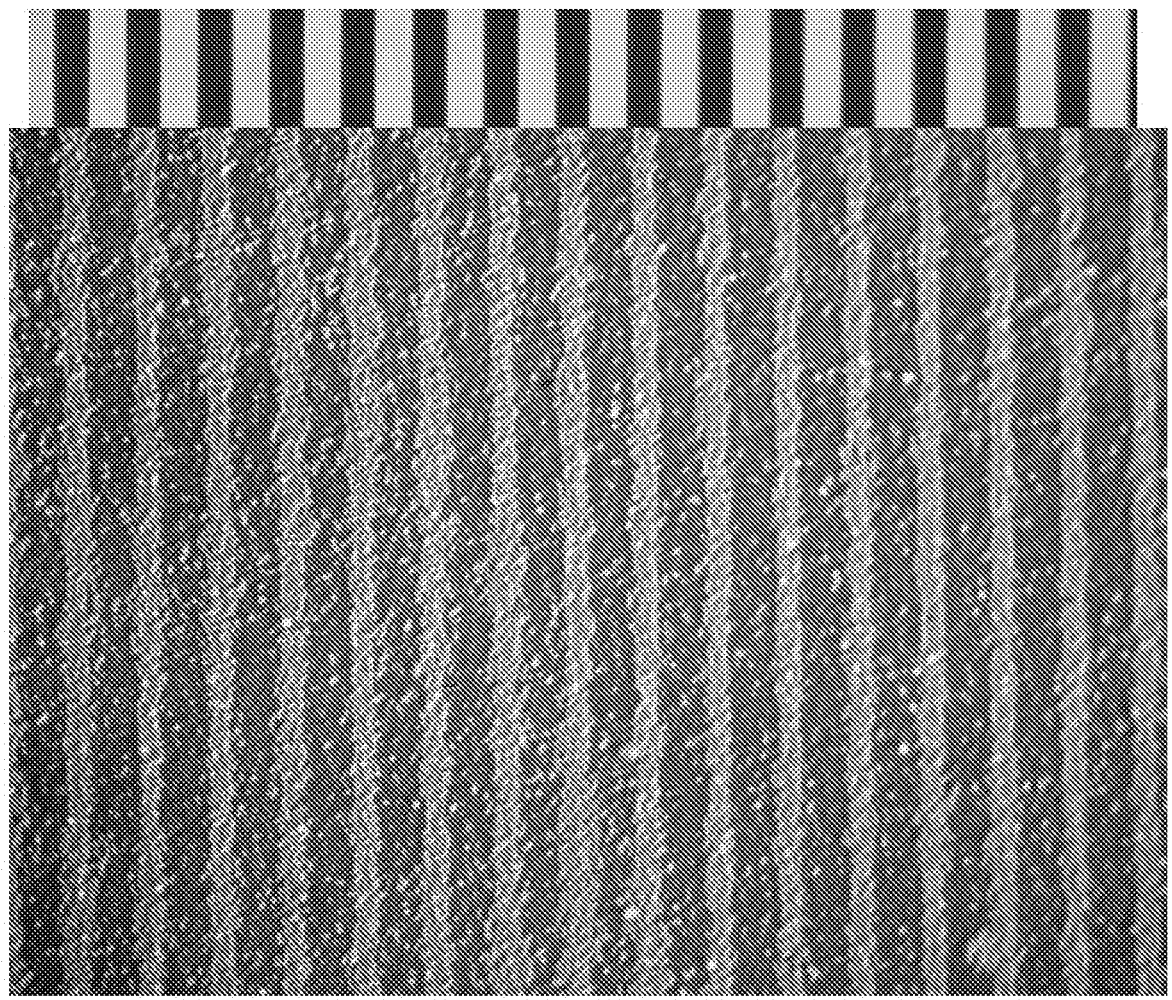
FIG. 11 shows the microchanneled $TiO_2$ film generated by the photoresist method.

This approach produces very sharp, well-defined channels as shown in FIG. 11, with the unexpected result that the photoresist is reversed to produce a "positive" image. That is the exposed, and therefore cross-linked, regions are removed by washing. This is illustrated by the insert of the exposure mask above the photograph. In some embodiments of this approach the remaining $TiO_2$.

What is claimed is:

1. A method for producing a patterned structure of microchannels on a substrate, comprising the steps of: (a) coating the substrate with a layer comprising a metal oxide film precursor and a linking agent precursor; (b) exposing the coated surface to patterned actinic radiation that activates the linking agent precursor in a patterned fashion to form a linking agent, the linking agent reacting with the metal oxide film precursor to produce a patterned structure of microchannels comprising a metal oxide film.

2. The method of claim 1, wherein the metal oxide film precursor comprises metal oxide particles.

3. The method of claim 1, wherein the metal oxide film precursor is a metal oxide sol gel.

4. The method of claim 1, wherein the metal oxide is selected from the group consisting of Aluminum Oxide ($Al_2O_3$), Zinc(II) Oxide (ZnO), Titanium(II) Oxide (TiO), Titanium(III) Oxide ($Ti_2O_3$), Titanium(IV) Oxide ($TiO_2$), Cerium(III) Oxide ($Ce_2O_3$), and Cerium(IV) Oxide (CeO2).

5. The method of claim 2, wherein the particles are nanoparticles.

6. The method of claim 2, wherein the particles are microparticles.

7. The method of claim 3, wherein the sol gel is formed by hydrolyzing a metal alkoxide solution by acid catalysis in situ.

8. The method of claim 7, wherein the metal alkoxide is a titanium alkoxide.

9. The method of claim 8, wherein the titanium alkoxide is titanium isopropoxide.

10. The method of claim 1, wherein the linking agent precursor is a protected oligocarboxylic acid.

11. The method of claim 10, wherein the oligocarboxylic acid is a di- or tri-carboxylic acid.

12. The method of claim 11, wherein the oligocarboxylic acid is terephthalic acid or trimeric acid.

13. The method of claim 10, wherein the oligocarboxylic acid comprises n carboxylic acid groups, and n−1 of those groups are protected.

14. The method of claim 13, wherein the linking agent precursor is activated by deprotecting at least a second carboxylic acid group.

15. The method of claim 10 wherein the oligocarboxylic acid is a fully protected oligocarboxylic acid.

16. The method of claim 15 wherein the linking agent precursor is activated by deprotecting at least two protected carboxylic acid groups.

17. The method of claim 1, wherein the linking agent precursor is directly activated.

18. The method of claim 17, wherein the linking agent precursor comprises an o-nitrobenzoyl ester group that is directly cleaved by light to release o-nitrobenzaldehyde.

19. The method of claim 1, wherein the linking agent precursor is indirectly activated.

20. The method of claim 19, further comprising applying a layer comprising a photoacid generator prior to step (b).

21. The method of claim 20, wherein the photoacid generator is activated in step (b) by exposure to actinic radiation, thereby generating a superacid that cleaves a protecting group on the linking agent precursor to form a linking agent.

22. The method of claim 21, wherein the photoacid generator is diphenyliodinium hexafluoroantimonate and the actinic radiation is visible light, and wherein exposure of the photoacid generator to visible light results in the creation of hexafluoroantimonic acid.

23. The method of claim 1, wherein the metal oxide film precursor and linking agent precursor are provided as a mixture.

24. The method of claim 1, wherein the linking agent precursor is added to the metal oxide film precursor.

* * * * *